US012684911B2

(12) United States Patent　　(10) Patent No.: US 12,684,911 B2
Zitzlsperger et al.　　(45) Date of Patent:　Jul. 14, 2026

(54) OPTOELECTRONIC COMPONENT

(71) Applicant: ams-OSRAM International GmbH, Regensburg (DE)

(72) Inventors: Michael Zitzlsperger, Regensburg (DE); Thomas Schwarz, Regensburg (DE); Hansjoerg Schoell, Bad Abbach (DE)

(73) Assignee: ams-OSRAM International GmbH, Regensburg (DE)

( * ) Notice: Subject to any disclaimer, the term of this patent is extended or adjusted under 35 U.S.C. 154(b) by 381 days.

(21) Appl. No.: 18/291,877

(22) PCT Filed: Jul. 18, 2022

(86) PCT No.: PCT/EP2022/069979

§ 371 (c)(1),
(2) Date: Jan. 24, 2024

(87) PCT Pub. No.: WO2023/006462

PCT Pub. Date: Feb. 2, 2023

(65) Prior Publication Data

US 2024/0429350 A1　　Dec. 26, 2024

(30) Foreign Application Priority Data

Jul. 29, 2021　(DE) ......................... 102021208179.7

(51) Int. Cl.
H10H 20/85　　(2025.01)
H10H 20/851　　(2025.01)
(Continued)

(52) U.S. Cl.
CPC ...... H10H 20/8506 (2025.01); H10H 20/851 (2025.01); H10H 20/855 (2025.01); H10H 20/857 (2025.01)

(58) Field of Classification Search
CPC ............. H10H 20/8506; H10H 20/851; H10H 20/855; H10H 20/857; H10H 20/852; H10H 20/853
See application file for complete search history.

(56) References Cited

U.S. PATENT DOCUMENTS 4,711,521 A　　12/1987　Thillays
6,075,237 A　*　6/2000　Ciccarelli ............... H10F 77/50
　　　　　　　　　　　　　　　　257/E31.118
(Continued)

FOREIGN PATENT DOCUMENTS

CN　　109449274 A　*　3/2019　.......... H10H 20/855
DE　102013204862 A1　10/2014
(Continued)

OTHER PUBLICATIONS

International Search Report and Written Opinion in PCT/EP2022/069979, mailed Nov. 18, 2022, 12 pages.
(Continued)

*Primary Examiner* — Scott B Geyer
(74) *Attorney, Agent, or Firm* — ArentFox Schiff LLP

(57) ABSTRACT

The invention relates to an optoelectronic component comprising a carrier, an optoelectronic semiconductor chip and a metal cover. The optoelectronic semiconductor chip has a top with a light-emitting surface. The optoelectronic semiconductor chip is disposed on a top of the carrier such that the light-emitting surface faces away from the top of the carrier. The cover is disposed above the top of the carrier and above the optoelectronic semiconductor chip. The cover has an opening, which is disposed above the light-emitting surface. A dam, which surrounds the light-emitting surface, is disposed on the top of the optoelectronic semiconductor chip.

19 Claims, 8 Drawing Sheets

(51) Int. Cl.
    *H10H 20/855*      (2025.01)
    *H10H 20/857*      (2025.01)

(56)            References Cited

U.S. PATENT DOCUMENTS

| | | | |
|---|---|---|---|
| 2007/0228405 A1 | 10/2007 | Tateiwa et al. | |
| 2010/0116970 A1 | 5/2010 | Chou et al. | |
| 2013/0168726 A1* | 7/2013 | Park | B29C 45/14655 |
| | | | 425/129.1 |
| 2014/0103378 A1* | 4/2014 | Lin | H10H 20/855 |
| | | | 257/98 |
| 2015/0287894 A1* | 10/2015 | Toita | A61L 2/10 |
| | | | 257/98 |
| 2016/0020369 A1* | 1/2016 | Ukawa | H10H 20/855 |
| | | | 29/841 |
| 2019/0043733 A1* | 2/2019 | Kapusta | H10W 70/092 |
| 2019/0097066 A1 | 3/2019 | Yu et al. | |
| 2019/0302350 A1 | 10/2019 | Yamaoka et al. | |
| 2020/0357775 A1* | 11/2020 | Hirasawa | H10H 20/853 |
| 2021/0151643 A1* | 5/2021 | Obara | H10H 20/855 |
| 2022/0384519 A1* | 12/2022 | Abe | H10H 20/8514 |
| 2024/0304735 A1* | 9/2024 | Zitzlsperger | H10F 77/50 |

FOREIGN PATENT DOCUMENTS

| | | | | |
|---|---|---|---|---|
| DE | 102013207111 A1 | | 11/2014 | |
| DE | 102014117983 A1 | | 6/2016 | |
| DE | 102021100530 A1 | * | 7/2022 | H10W 90/00 |
| JP | 2004-031560 A | | 1/2004 | |
| JP | 2006-186288 A | | 7/2006 | |
| JP | 2017-041561 A | | 2/2017 | |
| JP | 2021-057444 A | | 4/2021 | |
| TW | M490118 U | * | 11/2014 | F21K 9/65 |
| WO | WO-2018144494 A1 | * | 8/2018 | H10H 20/8586 |

OTHER PUBLICATIONS

Search Report in DE102021208179.7, mailed Mar. 24, 2022, 8 pages.

Japanese Office Action issued in corresponding Japanese Patent Application No. 2024-505192 dated Feb. 3, 2025.

\* cited by examiner

OPTOELECTRONIC COMPONENT

The present invention relates to an optoelectronic component.

This patent application is a National Stage of International Patent Application No. PCT/EP2022/069979, filed on Jul. 18, 2022, which claims the priority of German Patent Application No. 10 2021 208 179.7, filed on Jul. 29, 2021, the contents of the disclosures of which are hereby incorporated by reference in their entireties.

Optoelectronic components are known in various embodiments and are used for diverse purposes. For example, using light-emitting optoelectronic components as headlights in motor vehicles is known.

One object of the present invention is to provide an optoelectronic component. This object is achieved by an optoelectronic component having the features of the independent claim. Various refinements are specified in the dependent claims.

An optoelectronic component comprises a carrier, an optoelectronic semiconductor chip, and a metallic screen. The optoelectronic semiconductor chip has an upper side having a light-emitting surface. The optoelectronic semiconductor chip is arranged on an upper side of the carrier so that the light-emitting surface faces away from the upper side of the carrier. The screen is arranged above the upper side of the carrier and the optoelectronic semiconductor chip. The screen has an opening which is arranged above the light-emitting surface.

In this optoelectronic component, the screen arranged above the upper side of the carrier and the optoelectronic semiconductor chip prevents light incident from the outside on the optoelectronic component, such as sunlight, from striking sensitive, for example, temperature-sensitive, component parts of the optoelectronic component. Light incident on the screen of the optoelectronic component can be absorbed or reflected by the screen. The risk of damage to the optoelectronic component by incident light is advantageously reduced in this way.

In one embodiment of the optoelectronic component, a housing body is arranged on the upper side of the carrier. The optoelectronic semiconductor chip is arranged in a cavity of the housing body. The housing body can comprise, for example, a plastic material. The housing body is advantageously protected from light incident from the outside on the optoelectronic component by the screen.

In one embodiment of the optoelectronic component, the screen is fastened on an upper side of the housing body. For example, the screen can be fastened by means of an adhesive on the upper side of the housing body. This enables simple and cost-effective production of the optoelectronic component.

In one embodiment of the optoelectronic component, the screen has a light-absorbing coating. The light-absorbing coating advantageously prevents light reflected on the screen from striking other components in the surroundings of the optoelectronic component and displaying a damaging effect there. For example, a light absorption on a lower side and on lateral surfaces of the screen in the vicinity of the opening of the screen can be desirable to reduce scattered light there. Heat arising in the screen can be effectively dissipated by the metallic screen.

In one embodiment of the optoelectronic component, the screen has a connecting element, which is electrically conductively in contact with an electrical contact on the upper side of the carrier. The electrical contact can provide a reference potential, for example a ground potential. The screen of the optoelectronic component is advantageously at the reference potential in operation of the optoelectronic component and thus causes electromagnetic shielding. The EMC and ESD properties of the optoelectronic component can thus be improved.

In one embodiment of the optoelectronic component, the screen has a connecting element which forms an accessible soldering surface on a lower side of the optoelectronic component. In operation of the optoelectronic component, the screen can be connected via the soldering surface and the connecting element to a ground potential or another reference potential and can thus cause electromagnetic shielding. This can also improve the EMC and ESD properties of the optoelectronic component.

In one embodiment of the optoelectronic component, the connecting element is formed by a section of the screen bent over in relation to a surrounding area of the screen. This advantageously enables particularly simple and cost-effective production of the screen and simple installation of the screen.

In another embodiment of the optoelectronic component, the connecting element is fastened on the screen. The screen can thus advantageously be formed without openings in the area of the connecting element, due to which the screen can cause particularly complete shielding against light incident from the outside.

In one embodiment of the optoelectronic component, the screen has a side wall which laterally encloses an area between the carrier and the screen. The screen can thus advantageously cause particularly complete electromagnetic and electrostatic shielding of the component parts of the optoelectronic component.

In one embodiment of the optoelectronic component, the side wall is electrically conductively in contact with an electrical contact on the upper side of the carrier. The electrical contact can provide a reference potential, for example a ground potential. The screen of the optoelectronic component is thus advantageously at the reference potential in operation of the optoelectronic component and can thus cause electromagnetic shielding. This can improve the EMC properties of the optoelectronic component.

In one embodiment of the optoelectronic component, the side wall laterally encloses the carrier. The screen thus forms a hat which completely covers the remaining component parts of the optoelectronic component. Particularly effective shielding of the component parts of the optoelectronic component can be achieved in this way.

In one embodiment of the optoelectronic component, a section of the side wall forms an accessible soldering surface on a lower side of the optoelectronic component. The screen can thus be connected in operation of the optoelectronic component to a ground potential or another reference potential and can thus cause effective electromagnetic shielding of the optoelectronic component. This can improve the EMC properties of the optoelectronic component.

In one embodiment of the optoelectronic component, an edge area bordering the opening of the screen is bent in the direction toward the upper side of the carrier. This advantageously enables the opening of the screen to be formed having a particularly small opening area without the screen shading electromagnetic radiation emitted by the optoelectronic semiconductor chip. A small opening of the screen is accompanied by a particularly effective protection of the optoelectronic component from light incident from the outside.

In one embodiment of the optoelectronic component, a dam bordering the light-emitting surface is arranged on the upper side of the optoelectronic semiconductor chip. The dam can also, for example, cover bond wires connected to the optoelectronic semiconductor chip. The dam can be used to protect the light-emitting surface of the optoelectronic semiconductor chip.

In one embodiment of the optoelectronic component, a potting material is arranged in the cavity of the housing body. The optoelectronic semiconductor chip is at least partially embedded in the potting material. The potting material can be used to protect the optoelectronic semiconductor chip and to protect bond wires connected to the optoelectronic semiconductor chip.

In one embodiment of the optoelectronic component, an electrically conductive layer, which is electrically conductively connected to the screen, is arranged on the light-emitting surface. The electrically conductive layer can thus be in operation of the optoelectronic component at the same potential as the screen, in particular, for example, at a ground potential. Electromagnetic shielding achieved by the screen is thus also completed over the area of the opening of the screen.

In one embodiment of the optoelectronic component, the electrically conductive layer comprises a wavelength-converting material. The electrically conductive layer can thus advantageously additionally at least partially convert electromagnetic radiation emitted by the optoelectronic semiconductor chip into electromagnetic radiation of a different wavelength.

In one embodiment of the optoelectronic component, the electrically conductive layer is in direct contact with an electrical contact surface of the optoelectronic semiconductor chip or with a bond wire connected to the optoelectronic semiconductor chip. The electrically conductive layer and therefore also the screen can thus be connected to a fixed potential, in particular, for example, to a ground potential.

In one embodiment of the optoelectronic component, the electrically conductive layer extends on an upper side of the screen facing away from the carrier. This advantageously represents a simple possibility for electrically conductively connecting the electrically conductive layer to the screen.

In one embodiment of the optoelectronic component, the screen has a laser marking. The laser marking can be used, for example, as a label of the optoelectronic component or a label of an orientation of the optoelectronic component.

The above-described properties, features, and advantages of this invention and the manner in which they are achieved will become clearer and more comprehensible in conjunction with the following description of the exemplary embodiments, which are explained in more detail in conjunction with the drawings. In the schematic figures:

FIG. 1 shows a schematic side view in section of an optoelectronic component 100. The optoelectronic component 100 can be designed, for example, as a multi-pixel light source and can be provided for use in a front headlight of a motor vehicle.

Figure 1:
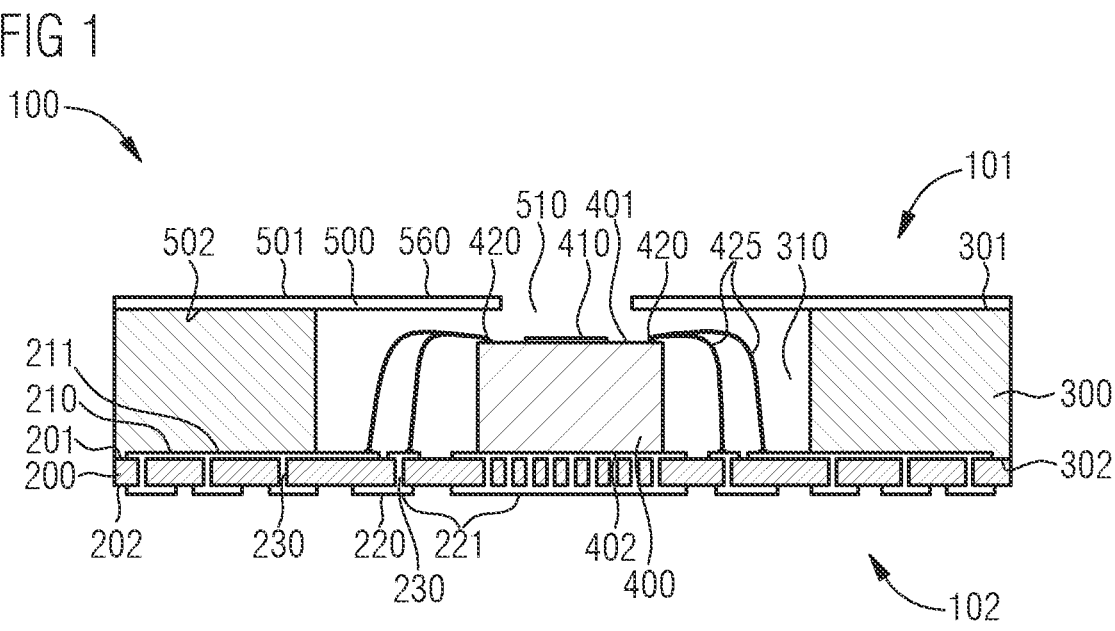
FIG. 1 shows a variant of an optoelectronic component.

The optoelectronic component 100 has an upper side 101 and a lower side 102 opposite to the upper side 101. In operation of the optoelectronic component 100, electromagnetic radiation is emitted at the upper side 101 of the optoelectronic component 100. The lower side 102 is provided as a mounting surface and for electrically contacting the optoelectronic component 100.

The optoelectronic component 100 comprises a carrier 200. The carrier 200 can also be designated as a substrate. The carrier 200 can be designed, for example, as a single layer or multilayer printed circuit board (PCB, MCB), as a ceramic carrier, or as a plastic carrier having embedded conductor frame. The carrier 200 has an upper side 201 and a lower side 202 opposite to the upper side 201. The lower side 202 of the carrier 200 forms the lower side 102 of the optoelectronic component 100.

An upper side metallization 210 having upper contact surfaces 211 is arranged on the upper side 201 of the carrier 200. A lower side metallization 220 having lower contact surfaces 221 is arranged on the lower side 202 of the carrier 200. The lower contact surfaces 221 are provided for electrically contacting the optoelectronic component 100. Sections of the upper side metallization 210 and sections of the lower side metallization 220 are electrically conductively connected to one another via through contacts 230 extending through the carrier 200.

A housing body 300 having an upper side 301 and a lower side 302 opposite to the upper side 301 is arranged on the upper side 201 of the carrier 200. In this case, the housing body 300 is arranged on the upper side 201 of the carrier 200 so that the lower side 302 of the housing body 300 faces toward the upper side 201 of the carrier 200. It is expedient for the housing body 302 to comprise an electrically insulating material, for example, a plastic material. The housing body 300 can have been arranged, for example, by a molding method on the upper side 201 of the carrier 200. However, the housing body 300 can also, for example, have been pre-produced and adhesively bonded on the upper side 201 of the carrier 200. The housing body 300 could also be formed integrally in one piece with the carrier 200.

The housing body 300 has a chip cavity 310. The chip cavity 310 forms an opening in the housing body 300, so that the upper side 201 of the carrier 200 is exposed in the area of the chip cavity 310. Upper contact surfaces 211 of the upper side metallization 210 of the carrier 200 are also accessible in the area of the chip cavity 310.

An optoelectronic semiconductor chip 400 is arranged in the chip cavity 310 of the housing body 300 on the upper side 201 of the carrier 200. The optoelectronic semiconductor chip 400 has an upper side 401 and a lower side 402 opposite to the upper side 401. A light-emitting surface 410 of the optoelectronic semiconductor chip 400 is formed on the upper side 401 of the optoelectronic semiconductor chip 400. The optoelectronic semiconductor chip 400 is arranged on the upper side 201 of the carrier 200 so that the light-emitting surface 410 faces away from the upper side 201 of the carrier 200.

The optoelectronic semiconductor chip 400 can be designed, for example, as a multi-pixel chip. In this case, the light-emitting surface 410 has a plurality of individually activatable image points (pixels). However, the light-emitting surface 410 can also be designed as a unified surface without divisions. The optoelectronic semiconductor chip 400 can also be designed as a system-on-a-chip (SoC) having integrated driver components. In this case, for example, the optoelectronic semiconductor chip 400 can be designed as a driver chip having an LED array arranged thereon.

The optoelectronic semiconductor chip 400 has electrical contact surfaces 420 on its upper side 401. The electrical contact surfaces 420 are electrically conductively connected via bond wires 425 to upper contact surfaces 211 on the upper side 201 of the carrier 200. The optoelectronic semiconductor chip 400 is thus electrically contacted. The optoelectronic semiconductor chip 400 could also have one or more electrical contact surfaces on its lower side 402, which are electrically conductively connected to one or more of the upper contact surfaces 211 of the carrier 200, for example, by means of a solder connection or an adhesive bond.

A metallic screen 500 is arranged on the upper side 301 of the housing body 300 of the optoelectronic component 100. The screen 500 is thus also arranged above the upper side 201 of the carrier 200 and above the optoelectronic semiconductor chip 400. The screen 500 has an upper side 501 and a lower side 502 opposite to the upper side 501. The lower side 502 of the screen 500 faces toward the upper side 301 of the housing body 300, the upper side 201 of the carrier 200, and upper side 401 of the optoelectronic semiconductor chip 400. The upper side 501 of the screen 500 forms the upper side 101 of the optoelectronic component 100. It is expedient that the screen 500 is fastened on the upper side 301 of the housing body 300. For example, the screen 500 can be adhesively bonded on the upper side 301 of the housing body 300.

The screen 500 comprises a metallic material. It is expedient to select this material so that its coefficient of thermal expansion corresponds as well as possible to that of the housing body 300, in order to avoid stresses and deformations due to different thermal expansions as much as possible in operation of the optoelectronic component 100. The screen 500 can be produced, for example, from a thin metal plate.

The screen 500 has an opening 510, which is arranged above the light-emitting surface 410 the of optoelectronic semiconductor chip 400. Electromagnetic radiation emitted in operation of the optoelectronic component 100 on the light-emitting surface 410 of the optoelectronic semiconductor chip 400 can thus pass through the opening 510 of the screen 500 and can be emitted at the upper side 101 of the optoelectronic component 100.

The size of the opening 510 is dimensioned so that the screen 500 causes the least possible shading of the radiation emitted by the optoelectronic semiconductor chip 400, but at the same time the components of the optoelectronic component 100 are shielded as completely as possible by the screen 500 from radiation incident from the outside on the optoelectronic component 100.

Radiation incident at the installation location of the optoelectronic component 100 from the outside on the optoelectronic component 100, for example, sunlight, is absorbed or reflected by the screen 500. A light-absorbing coating 560 can be arranged for this purpose on the upper side 501 of the screen 500. The light-absorbing coating 560 can also extend onto other sections of the screen 500 or can be provided exclusively in other sections of the screen 500 to reduce scattering of radiation emitted by the optoelectronic semiconductor chip 400. For example, the light-absorbing coating 560 can be arranged on the lower side 502 and on lateral surfaces of the screen 500 in the vicinity of the opening 510. However, such a coating can also be omitted. Excess local heating due to the radiation incident from the outside and damage to the optoelectronic component 100 thus caused are prevented by the thermal conductivity of the metallic screen 500.

The bond wires 425 extending in the chip cavity 310 can be largely covered by the screen 500 and thus protected from damage due to external effects. This can allow further measures for protecting the bond wires 425 to be omitted.

Further variants of the optoelectronic component 100 will be described hereinafter on the basis of FIGS. 2 to 15. It is essentially only described how these variants differ from the variant of the optoelectronic component 100 shown in FIG. 1. Otherwise, the above description of the optoelectronic component 100 also applies to the variants of the optoelectronic component 100 explained hereinafter.

In the variants of the optoelectronic component 100 described hereinafter, in addition to its function as a protection from radiation incident from the outside (such as sunlight), the screen 500 is also used for electromagnetically shielding the optoelectronic component 100. The variants of the optoelectronic component 100 described hereinafter can thus have advantageous properties with respect to the electromagnetic compatibility (EMC properties). This is reasonable in particular if the optoelectronic component 100 has high frequency components, for example, high-frequency components integrated in the optoelectronic semiconductor chip 400.

The electromagnetic shielding caused by the screen 500 is achieved in the variants of the optoelectronic component 100 described hereinafter in that the electrically conductive screen 500 is electrically connected to a defined electrical reference potential of the optoelectronic component 100, in particular, for example, to a ground potential. However, the reference potential can also be a VDD potential, for example.

Figure 2:
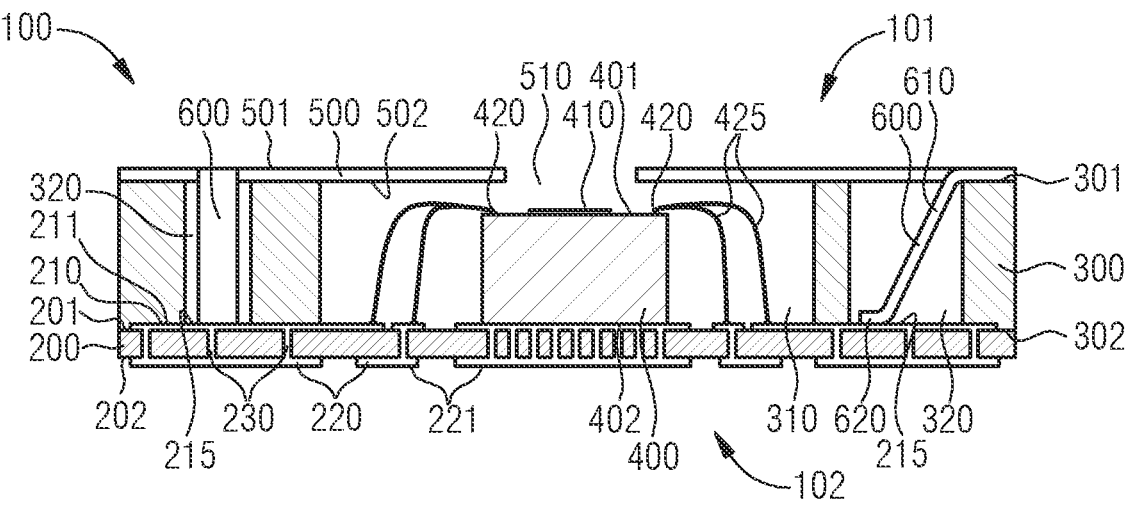
FIG. 2 shows a further variant of an optoelectronic component.

FIG. 2 shows a schematic side view in section of a variant of the optoelectronic component 100. In the variant of the optoelectronic component 1 shown in FIG. 2, the screen 500 has two connecting elements 600, which are electrically conductively in contact with a reference contact 215 on the upper side 201 of the carrier 200. Alternatively, only one such connecting element 600 or more than two such connecting elements 600 could also be provided. The reference contact 215 is formed by an upper contact surface 211 of the upper side metallization 210 of the carrier 200, which provides a defined reference potential, for example, a ground potential or a VDD potential.

The connecting elements 600 are formed by sections 610 of the screen 500 bent over in relation to the surrounding areas of the screen 500. The connecting elements 600 thus have the form of spring tongues. The bent-over sections 610 forming the connecting elements 600 can be stamped free in relation to the surrounding areas of the screen 500, for example.

The electrical contact between the connecting elements 600 and the reference contact 215 on the upper side 201 of the carrier 200 can be established in that contact areas 620 formed at the longitudinal ends of the connecting elements 600 press with spring force against upper contact surfaces 211 of the upper side metallization 210 of the carrier 200, which surfaces form the reference contact 215. This provides the advantage that it is possible to compensate for thermal deformations occurring in operation of the optoelectronic component 100. However, there can also be a rigid mechanical connection between the contact areas 620 and the upper contact surfaces 211 forming the reference contact 215, for example a connection by spot welds.

In the example shown in FIG. 2, each connecting element 600 extends through a respective separate connecting element cavity 320 in the housing body 300. However, a common connecting element cavity 320 could also be provided for all connecting elements 600. The connecting elements 600 could alternatively also be arranged in the chip cavity 310.

Figure 3:
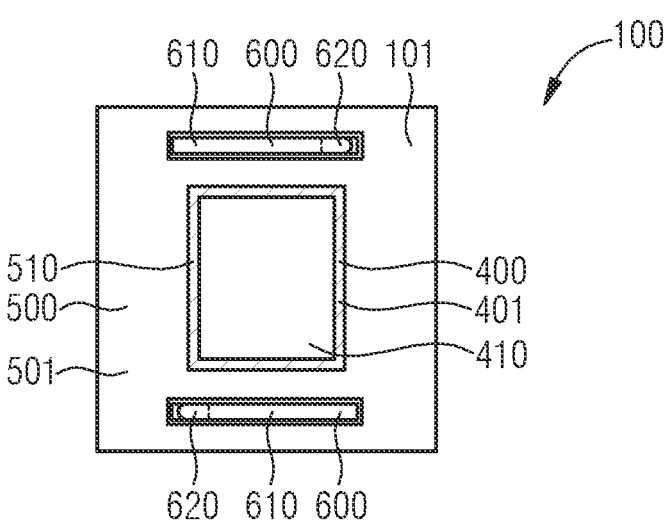
FIG. 3 shows a top view of a variant of an optoelectronic component.

FIG. 3 shows a schematic representation of a top view of the upper side 101 of a variant of the optoelectronic component 100. The variant of FIG. 3, like the variant of FIG. 2, has two connecting elements 600 and shows a possible arrangement of these connecting elements 600. The connecting elements 600 are arranged on both sides of the optoelectronic semiconductor chip 400 and are oriented antiparallel. In this way, spring forces caused by the connecting elements 600 advantageously balance out. However, other arrangements of the connecting elements 600 are also possible.

Figure 4:
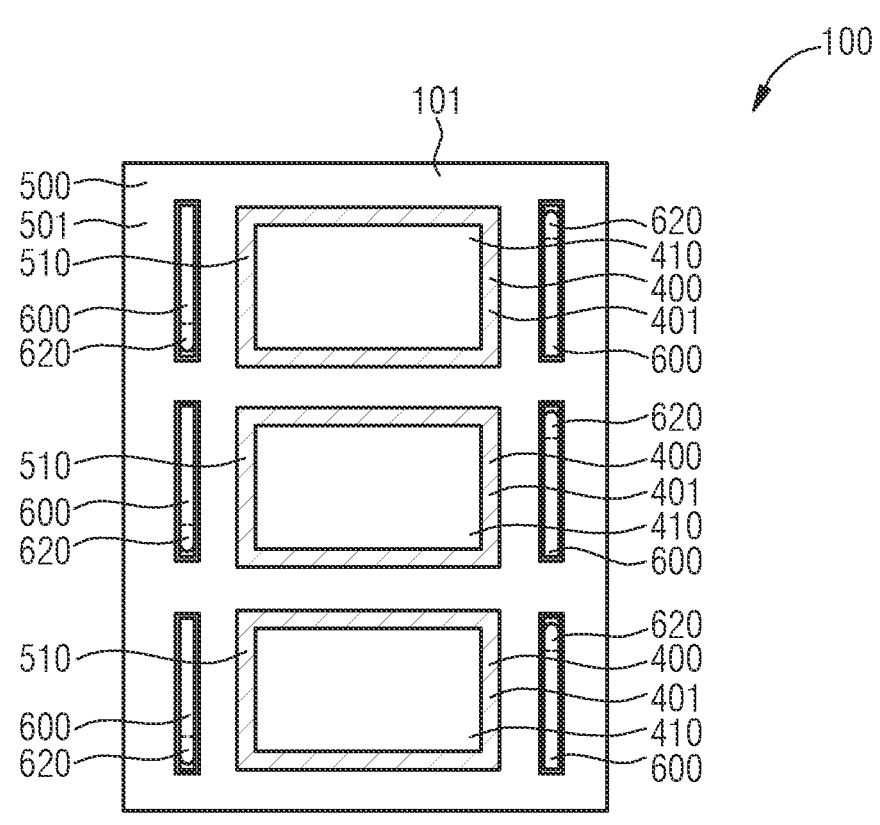
FIG. 4 shows a top view of a further variant of an optoelectronic component.

FIG. 4 shows a schematic top view of the upper side 101 of a further variant of the optoelectronic component 100. In the variant of FIG. 4, the optoelectronic component 100 has three optoelectronic semiconductor chips 400, which are each arranged adjacent to one another in separate chip cavities 310. Accordingly, the screen 500 has three openings 510, which are arranged above the light-emitting surfaces 410 of the optoelectronic semiconductor chip 400. Six connecting elements 600 are provided, of which two are arranged in each case on both sides of an optoelectronic semiconductor chip 400 and are oriented in opposite directions. The variant of the optoelectronic component 100 shown in FIG. 4 can thus be theoretically divided into three sections, each of which is formed like the variant of the optoelectronic component 100 shown in FIG. 3.

The three optoelectronic semiconductor chips 400 of the variant of the optoelectronic component 100 shown in FIG. 4 can be designed, for example, to emit electromagnetic radiation having different wavelengths. For example, the three optoelectronic semiconductor chips 400 can be designed to emit electromagnetic radiation having red, green, and blue light color.

Of course, a different number of optoelectronic semiconductor chips 400 is also possible. The optoelectronic semiconductor chips 400 can also be positioned in a different geometric arrangement relative to one another. It is possible to arrange several or all of the optoelectronic semiconductor chips 400 in a common chip cavity 310 of the housing body 300.

Figures 5, 6:
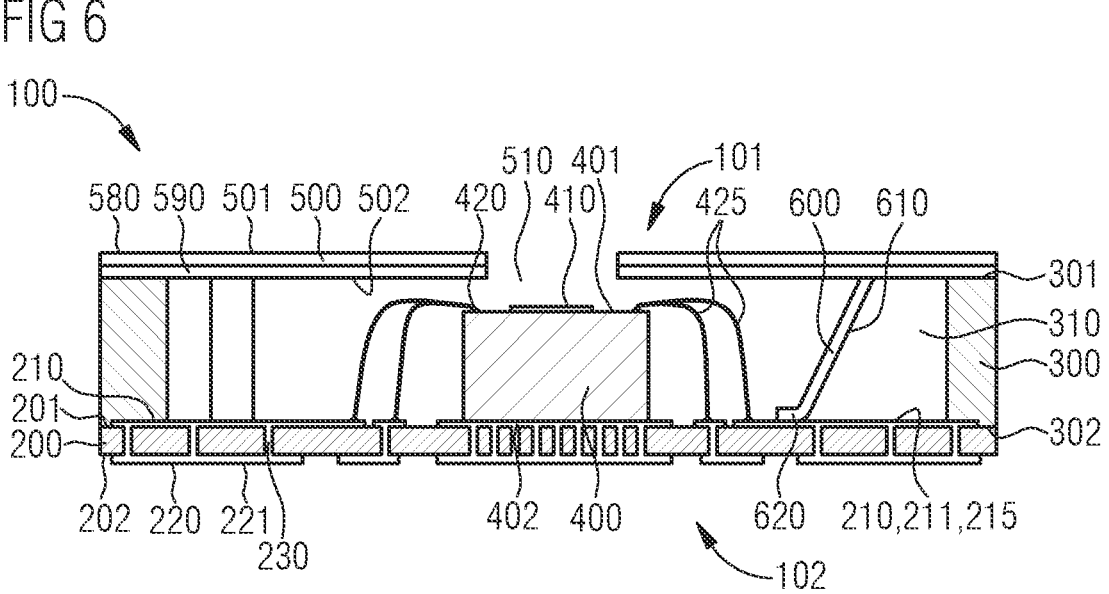
FIG. 5 shows a further variant of an optoelectronic component.
FIG. 6 shows a further variant of an optoelectronic component.

FIG. 5 shows a schematic side view in section of a further variant of the optoelectronic component 100. The variant shown in FIG. 5 also has two connecting elements 600, which electrically conductively connect the screen 500 to the reference contact 215 on the upper side 201 of the carrier 200. Of course, a different number of connecting elements 600 and a different geometric arrangement of the connecting elements 600 would again also be possible.

In the variant shown in FIG. 5, the connecting elements 600 are formed as separate elements and are fastened in fastening sections 630 to the lower side 502 of the screen 500. This fastening can be implemented, for example, by soldering, welding, or adhesive bonding. Due to the design of the connecting elements 600 as separate elements, the screen 500 in the variant of the optoelectronic component 100 shown in FIG. 5 has no openings in the area of the connecting elements 600. The screen 500 in the variant shown in FIG. 5 can thus cause particularly effective protection against sunlight and other radiation incident from the outside.

In the variant of the optoelectronic component 100 shown in FIG. 5, the connecting elements 600 are arranged jointly with the optoelectronic semiconductor chip 400 in the chip cavity 310 of the housing body 300. Of course, it would also be possible to arrange the connecting elements 600 in separate connecting element cavities 320 of the housing body 300.

FIG. 6 shows a schematic side view in section of a further variant of the optoelectronic component 100. In the variant shown in FIG. 6, the screen 500 has an upper part 580 and a lower part 590, which are each formed as thin plates and are arranged flatly one above the other. The upper part 580 and the lower part 590 can be connected to one another here, for example, via an adhesive bond. An upper side of the upper part 580 forms the upper side 501 of the screen 500. A lower side of the lower part 590 forms the lower side 502 of the screen 500.

The variant shown in FIG. 6 has two connecting elements 600, which are formed by sections 610 of the lower part 590 of the screen 500 bent over in relation to the surrounding areas of the lower part 590 of the screen 500. The upper part 580 of the screen 500 is also closed in the area of the connecting elements 600. The screen 500 in the variant of the optoelectronic component 100 shown in FIG. 6 thus also as a whole does not have any openings in the area of the connecting elements 600.

Figure 7:
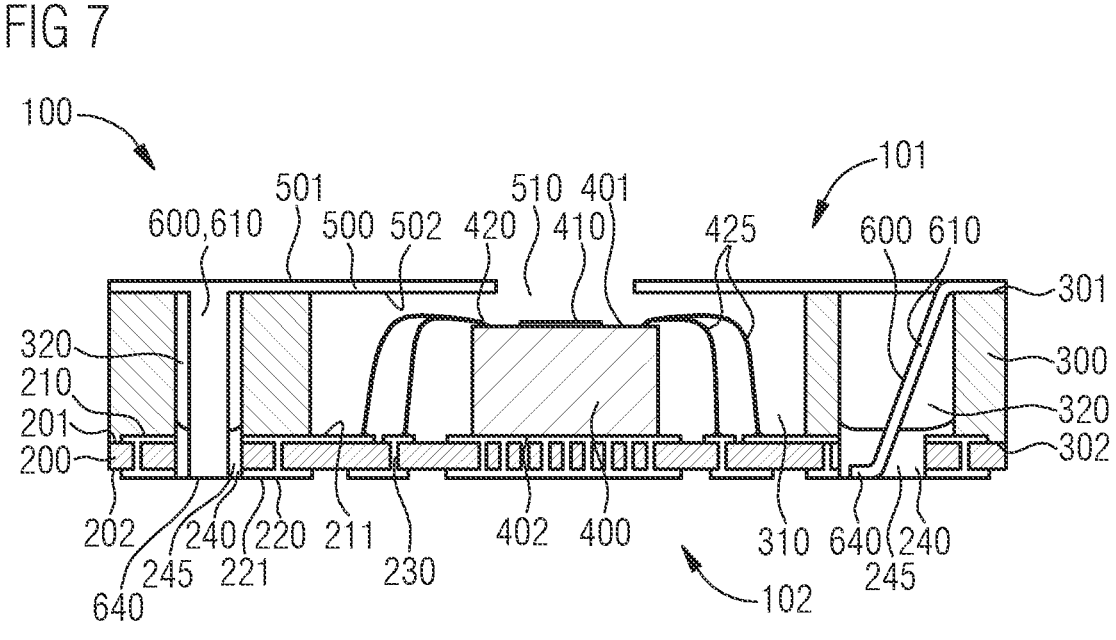
FIG. 7 shows a further variant of an optoelectronic component.

FIG. 7 shows a schematic side view in section of a further variant of the optoelectronic component 100. In the variant shown in FIG. 7, the connecting elements 600 are again formed by sections 610 bent over in relation to the surrounding areas of the screen 500, as is also the case in the variant of FIG. 2. However, the connecting elements 600 could also be formed as separate elements fastened on the screen 500, as in the variant of FIG. 5, or from a lower part 590 of the screen 500, as in the variant of FIG. 6. In the variant of FIG. 7, the connecting elements 600 again each extend through separate connecting element cavities 320 of the housing body 300, but could alternatively also be arranged in the chip cavity 310.

In the variant of the optoelectronic component 100 shown in FIG. 7, the connecting elements 600 are not in contact with a reference contact on the upper side 201 of the carrier 200. Instead, the connecting elements 600 extend through openings 240 of the carrier 200 and each have an accessible soldering surface 640 on the lower side 102 of the optoelectronic component 100. During the assembly of the optoelectronic component 100, these soldering surfaces 640 are electrically conductively connected to a ground potential or another fixed potential.

A fastening material 245, which fixes the connecting elements 600, can be arranged in the area of the openings 240 of the carrier 200. The fastening material 245 can be, for example, a silver conductive adhesive. The fastening material 245 can also be an electrically insulating material, however, and can be used for electrically insulating the connecting elements 600 in relation to the carrier 200 and the upper side metallization 210 and the lower side metallization 220.

Figure 8:
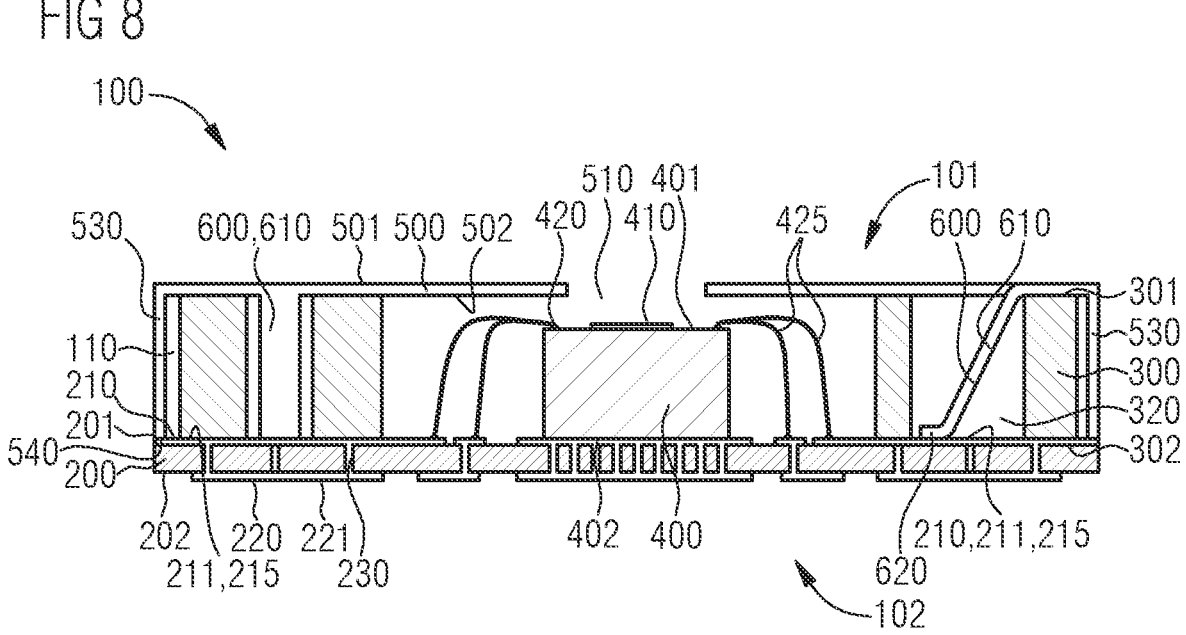
FIG. 8 shows a further variant of an optoelectronic component.

FIG. 8 shows a schematic side view in section of a further variant of the optoelectronic component 100. In the variant shown in FIG. 8, the connecting elements 600 of the screen 500 are designed as in the variant of the optoelectronic component 100 shown in FIG. 2. However, the connecting elements 600 could also be designed as in the variants of the optoelectronic component 100 shown in FIG. 5, 6, or 7.

In the variant of the optoelectronic component 100 shown in FIG. 8, the screen 500 has a side wall 530, which is oriented perpendicularly to the other sections of the screen 500. The screen 500 thus has a cup shape as a whole. The side wall 530 laterally encloses an area 110 between the carrier 200 and the screen 500. The cup-shaped screen 500 thus also encloses the housing body 300. In this way, the screen 500 in the variant of the optoelectronic component 100 shown in FIG. 8 causes particularly effective electromagnetic shielding. In the variant shown in FIG. 8, the side wall 530 of the screen 500 is seated on the upper side 201 of the carrier 200.

Figure 9:
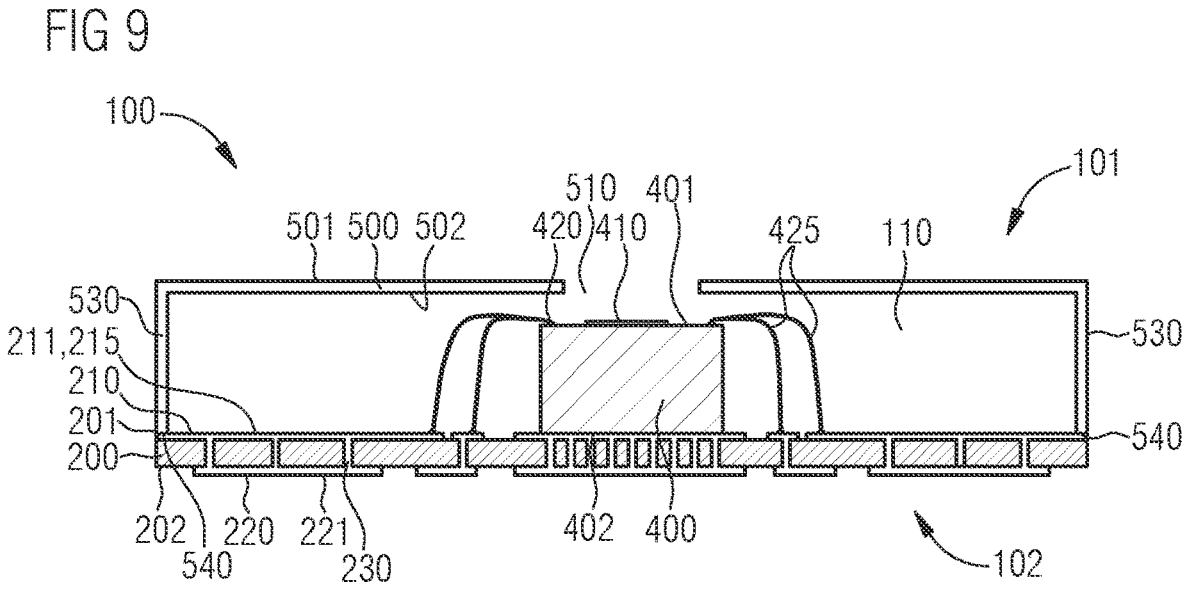
FIG. 9 shows a further variant of an optoelectronic component.

FIG. 9 shows a schematic side view in section of a further variant of the optoelectronic component 100. In the variant shown in FIG. 9, the screen 500 also has the side wall 530 described on the basis of FIG. 8, which laterally encloses the area 110 between the carrier 200 and the screen 500. However, the screen 500 in the variant shown in FIG. 9 does not have connecting elements 600. Instead, the side wall 530 of the screen 500, where it presses against the upper side 201 of the carrier 200, forms a contact area 540, which is electrically conductively in contact with a reference contact 215 on the upper side 201 of the carrier 200. The screen 500 is thus also electrically conductively connected to the potential of the reference contact 215 in the variant shown in FIG. 9.

In the variant of the optoelectronic component 100 shown in FIG. 9, no housing body 300 is present. This is possible in that the screen 500 encloses the area 110 between the carrier 200 and the screen 500 and thus protects it from external effects. The housing body 300 could also be omitted in the variant of the optoelectronic component 100 shown in FIG. 8. Alternatively, however, the variant of the optoelectronic component 100 shown in FIG. 9 could also have such a housing body 300.

Figure 10:
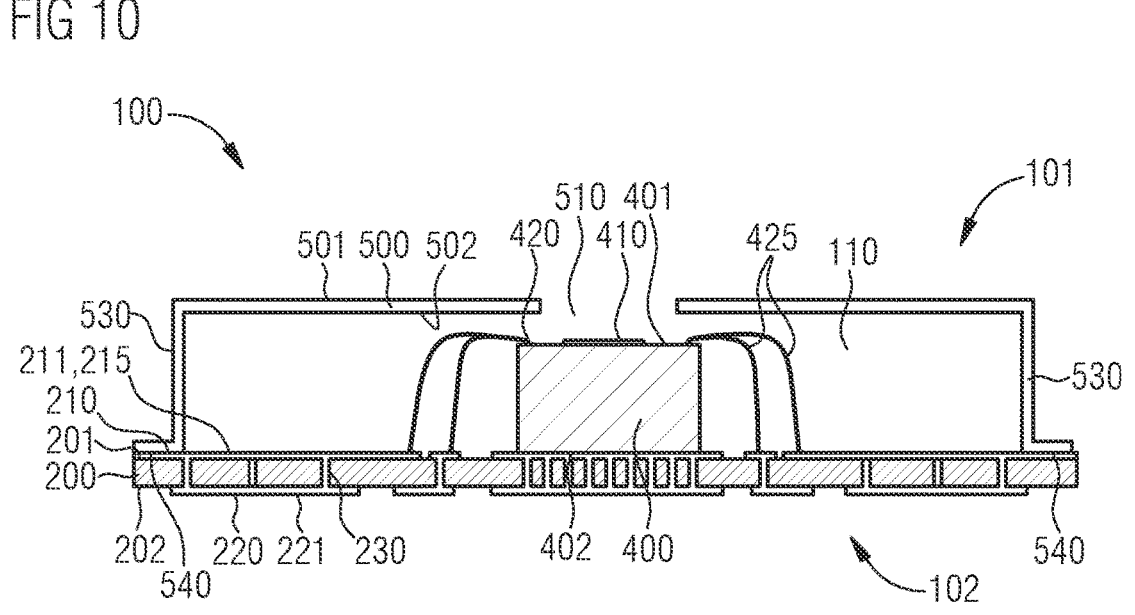
FIG. 10 shows a further variant of an optoelectronic component.

FIG. 10 shows a schematic side view in section of a further variant of the optoelectronic component 100. The variant shown in FIG. 10 differs from the variant of FIG. 9 in that the contact area 540 of the side wall 530 of the screen 500 is expanded by an additional collar. This facilitates connecting the contact area 540 mechanically and electrically conductively to the upper side 201 of the carrier 200 and the reference contact 215 arranged on the upper side 201 of the carrier 200. The connection can be an adhesive bond, for example.

Figure 11:
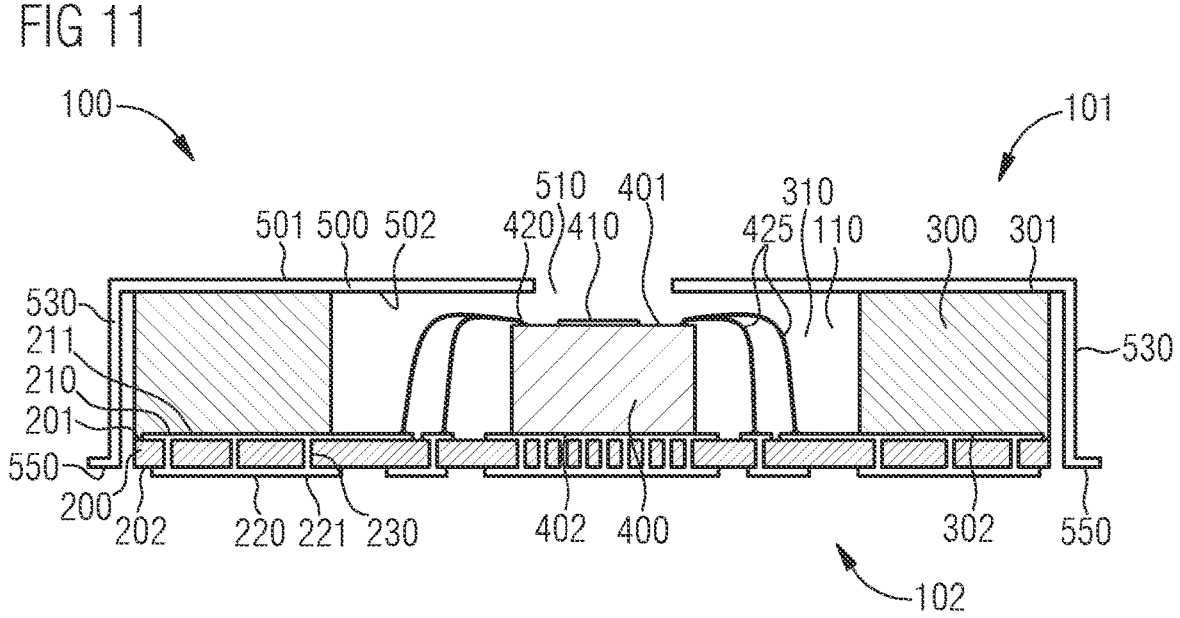
FIG. 11 shows a further variant of an optoelectronic component.

FIG. 11 shows a schematic side view in section of a further variant of the optoelectronic component 100. In the variant of FIG. 11, a housing body 300 is present. The screen 500 is fastened on the upper side 301 of the housing body 300. The screen 500 does not have connecting elements 600, but again has a side wall 530 instead, which laterally encloses the area 110 between the carrier 200 and the screen 500. In addition, the side wall 530 also laterally encloses the carrier 200 in the variant of FIG. 11. The side wall 530 of the screen 500 is therefore not seated on the upper side 201 of the carrier 200. Instead, the side wall 530 has a soldering surface 550, which is arranged in a common plane with the lower contact surfaces 221 on the lower side 202 of the carrier 200 and is thus accessible on the lower side 102 of the optoelectronic component 100. During the assembly of the optoelectronic component 100, the soldering surface 550 of the screen 500 is electrically conductively connected to a reference potential.

Figure 12:
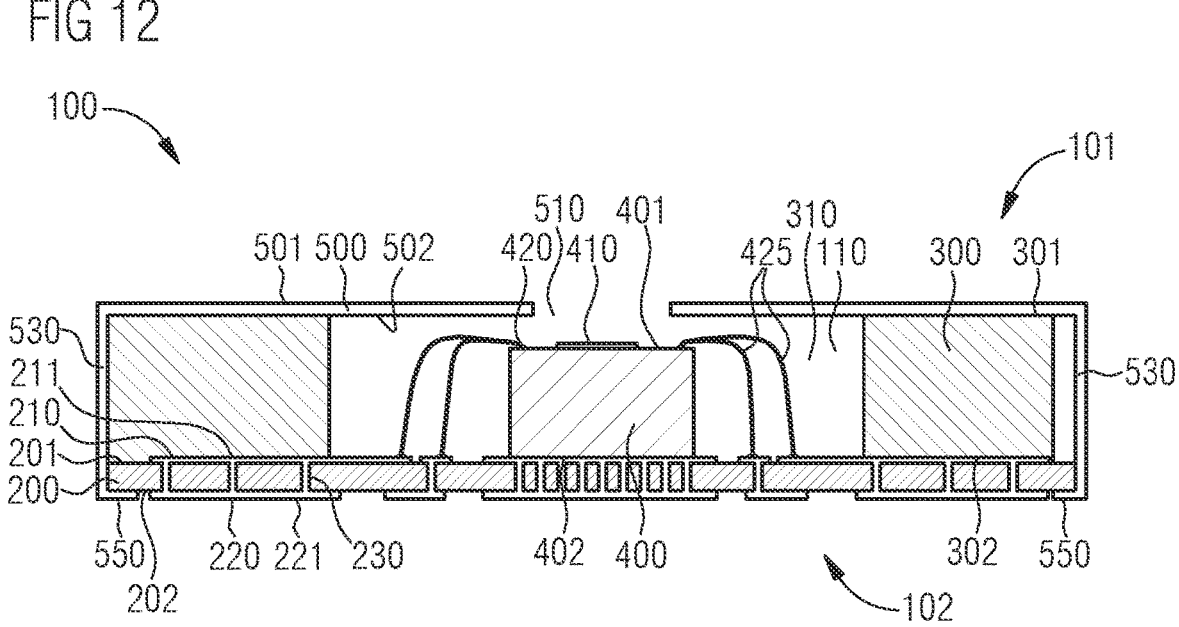
FIG. 12 shows a further variant of an optoelectronic component.

FIG. 12 shows a schematic side view in section of a further variant of the optoelectronic component 100. The variant shown in FIG. 12 is designed similarly to the variant shown in FIG. 11, so that the side wall 530 of the screen 500 also laterally encloses the carrier 200 in the variant shown in FIG. 12 and has a section which forms a soldering surface 530 accessible on the lower side 102 of the optoelectronic component 100. In addition, the side wall 530 of the screen 500 is mechanically connected to the carrier 200 in this area in the variant shown in FIG. 12, for example, via a clamped or crimped connection. The housing body 300 can thus optionally also be omitted in the variant shown in FIG. 12.

Figure 13:
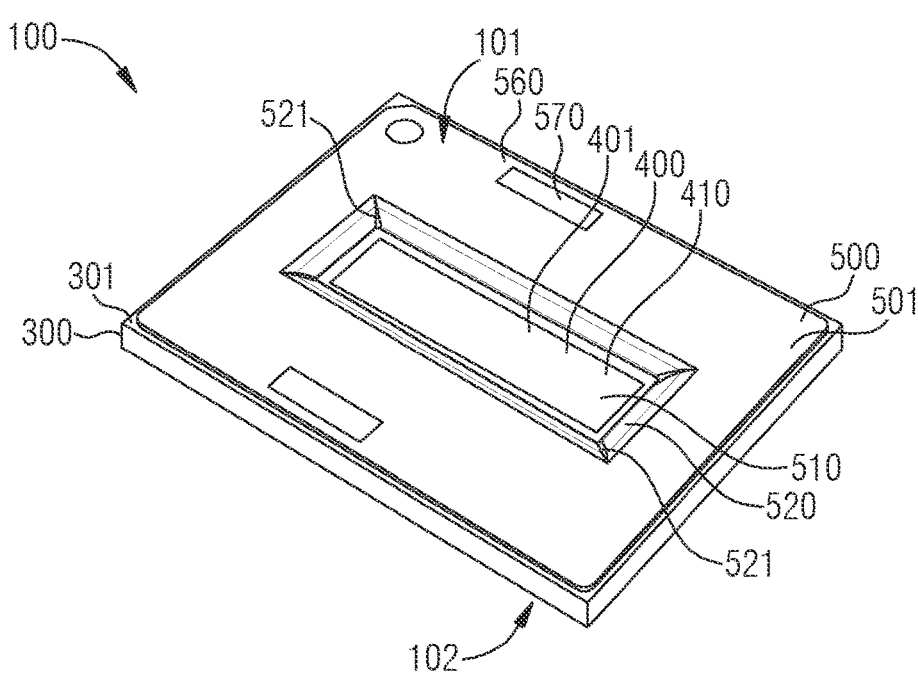
FIG. 13 shows a further variant of an optoelectronic component.

FIG. 13 shows a schematic side view in section of a further variant of the optoelectronic component 100. In the variant shown in FIG. 13, the screen 500 is designed similarly as in the variant of FIG. 9. The screen 500 could alternatively also be designed as in one of the other described variants, however.

In addition, in the variant of the optoelectronic component 100 shown in FIG. 13, an edge area 520 of the screen 500 bordering the opening 510 of the screen 500 is bent in the direction toward the upper side 201 of the carrier 200 and the upper side 401 of the optoelectronic semiconductor chip 400. The opening 510 of the screen 500 can thus have a smaller size in the variant shown in FIG. 13 without electromagnetic radiation emitted on the light-emitting surface 410 of the optoelectronic semiconductor chip 400 being shaded by the screen 500. Even more effective protection of the bond wires 425 arranged in the area 110 between the carrier 200 and the screen 500 can also be achieved by the bending of the edge area 520.

Figure 14:
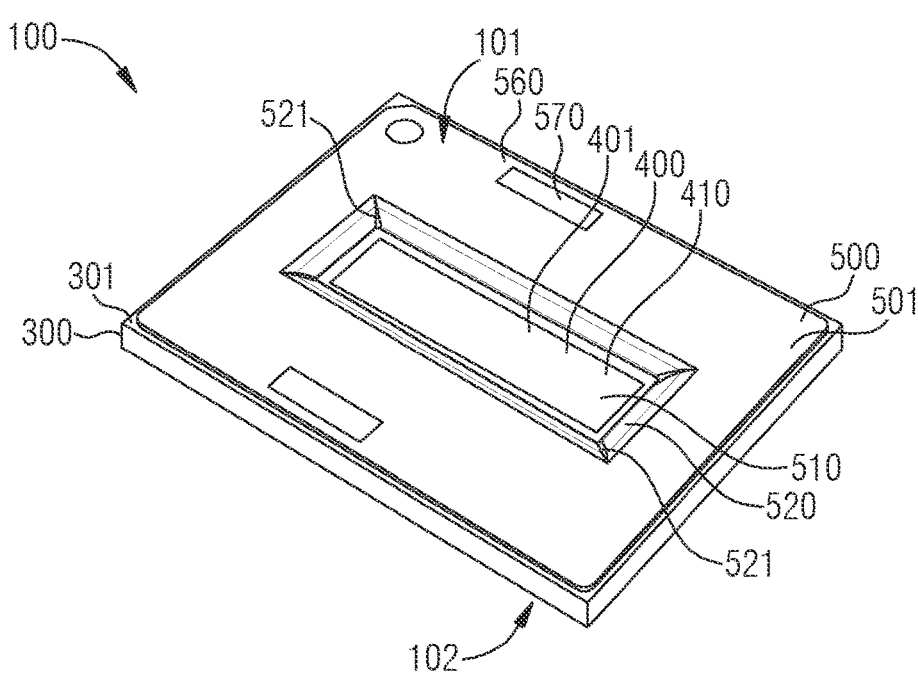
FIG. 14 shows a top view of a variant of an optoelectronic component.

FIG. 14 shows a top view of the upper side 101 of a further variant of the optoelectronic component 100. The edge area 520 bordering the opening 510 of the screen 500 is also bent in the direction toward the upper side 201 of the carrier 200 in the variant shown in FIG. 14. It can be seen in FIG. 14 that the screen 500 has slots 521 originating from corners of the rectangular opening 510 for this purpose. The edge area 520 is divided into four wings by the slots 521, which are each bent over in the direction toward the upper side 201 of the carrier 200 and toward the upper side 401 of the optoelectronic semiconductor chip 400.

An alternative possibility is to bend the edge area 520 of the opening 510 of the screen 500 by deep drawing in the direction toward the upper side 201 of the carrier 200. The necessity of providing slots 521 is thus dispensed with in this way, by which even more complete shielding of the component parts of the optoelectronic component 100 by the screen 500 can be achieved.

An edge area 520 bent as in the screen 500 of the variant of the optoelectronic component 100 shown in FIG. 13 can also be provided in the variants of the optoelectronic component 100 described on the basis of the other figures.

In the variant of the optoelectronic component 100 shown in FIG. 13, a dam 700 bordering the light-emitting surface 410 of the optoelectronic semiconductor chip 400 is arranged on the upper side 401 of the optoelectronic semiconductor chip 400. The dam 700 expediently comprises an electrically insulating material. In the illustrated example, the dam 700 at least partially covers the electrical contact surfaces 420 on the upper side 401 of the optoelec-tronic semiconductor chip 400, so that the bond wires 425 connected to the electrical contact surfaces 420 are at least partially embedded in the dam 700. Alternatively, it is possible to arrange the dam 700 between the electrical contact surfaces 420 and the light-emitting surface 410 of the optoelectronic semiconductor chip 400, so that the electrical contact surfaces 420 and the bond wires 425 connected to the electrical contact surfaces 420 are arranged outside the area bordered by the dam 700.

In addition, in the variant of the optoelectronic component 100 shown in FIG. 13, a potting material 710 is arranged in the chip cavity 310 of the housing body 300. The potting material 710 covers the upper side 201 of the carrier 200 accessible in the area of the chip cavity 310 and extends from the wall of the housing body 300 delimiting the chip cavity 310 to the optoelectronic semiconductor chip 400, so that the optoelectronic semiconductor chip 400 is at least partially embedded in the potting material 710. The bond wires 425 extending between the electrical contact surfaces 420 of the optoelectronic semiconductor chip 400 and the upper contact surfaces 211 on the upper side 201 of the carrier 200 are thus also at least partially embedded in the potting material 710 and thus protected from damage.

The potting material 710 can have been arranged in the chip cavity 310, for example, by means of a metering method. The dam 700 can have been used in this case to prevent the light-emitting surface 410 on the upper side 401 of the optoelectronic semiconductor chip 400 from being covered by the potting material 710. Depending on the position of the dam 700, however, the potting material 710 can also have covered the electrical contact surfaces 420 on the upper side 401 of the optoelectronic semiconductor chip 400 and thus cause additional protection of the bond wires 425 connected to the electrical contact surfaces 420. It can also be possible to arrange the potting material 710 in the chip cavity 310, without providing the dam 700.

The dam 700 and the potting material 710 can also be provided in all other variants of the optoelectronic compo-nent 100 which have a housing body 300 having a chip cavity 310.

In the variant of the optoelectronic component 100 shown in FIG. 14, a laser marking 570 is provided on the upper side 501 of the screen 500 forming the upper side 101 of the optoelectronic component 100. The laser marking 570 can identify, for example, an orientation of the optoelectronic component 100 or a type of the optoelectronic component 100. A corresponding laser marking 570 can also be pro-vided in the other variants of the optoelectronic component 100.

Figure 15:
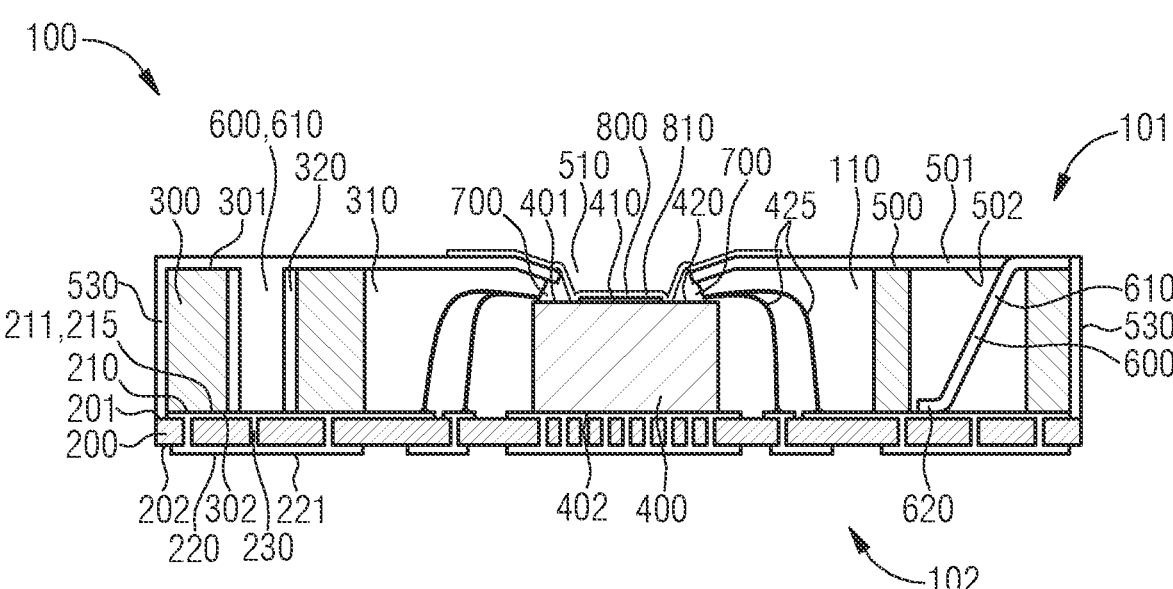
FIG. 15 shows a further variant of an optoelectronic component.

FIG. 15 shows a schematic side view in section of a further variant of the optoelectronic component 100. In this variant, the screen 500, as in the variant of the optical component 100 shown in FIG. 2, has connecting elements 600, which are arranged in connecting element cavities 320 of the housing body 300. In addition, the screen 500 has a side wall 530, which laterally encloses the area 110 between the screen 500 and the carrier 200.

In addition, the edge area 520 of the opening 510 of the screen 500 is bent over in the direction toward the carrier 200 and the optoelectronic semiconductor chip 400, as has been described on the basis of FIGS. 13 and 14. Of course, the screen 500 could also be formed having the features described on the basis of the other figures.

A dam 700 bordering the light-emitting surface 410, as was described on the basis of FIG. 13, is arranged on the upper side 401 of the optoelectronic semiconductor chip

400. The potting material 710 present in the variant of FIG. 13 is not present in the variant of FIG. 15 but could likewise be present. Alternatively, the dam 700 could also be omitted.

The variant of the optoelectronic component 100 shown in FIG. 15 has an electrically conductive layer 800, which is arranged on the light-emitting surface 410 on the upper side 401 of the optoelectronic semiconductor chip 400. The electrically conductive layer 800 is electrically conductively connected to the screen 500. The electrically conductive layer 800 thus also completes the electromagnetic shielding achieved by the screen 500 in the area above the light-emitting surface 410, where the screen 500 has the opening 510.

It is expedient that the electrically conductive layer 800 comprises a wavelength-converting material 810. The elec-trically conductive layer 800 can thus be used to convert electromagnetic radiation emitted by the optoelectronic semiconductor chip 400 at the light-emitting surface 410 at least partially into electromagnetic radiation of a different wavelength.

The electrical conductivity of the electrically conductive layer 800 can be achieved, for example, by the electrically conductive particles admixed to the wavelength-converting material 810. Vice versa, the wavelength-converting mate-rial 810 can also be introduced into an already electrically conductive matrix, for example an electrically conductive polymer. The electrically conductive layer 800 can also be constructed in multiple layers and can have, for example, at least one transparent electrically conductive layer and one wavelength-converting layer. A further possibility is to pro-vide an electrically conductive grid or network which is arranged on or below a layer comprising the wavelength-converting material 810. The wavelength-converting mate-rial 810 can also be arranged in the meshes of this electri-cally conductive grid. The mesh size of the electrically conductive grid or network can be adapted here to the electromagnetic frequencies to be shielded. If the light-emitting surface 410 of the optoelectronic semiconductor chip 400 is divided into individual pixels, the mesh size of the electrically conductive grid or network can also be adapted to the size of these pixels. A contrast between the individual pixels of the light-emitting surface 410 can thus additionally be increased.

In the variant of the optoelectronic component 100 shown in FIG. 15, the electrically conductive layer 800 is electri-cally conductively connected to the screen 500 in that the electrically conductive layer 800 extends continuously to the upper side 501 of the screen 500. The electrically conductive layer 800 thus forms a coherent layer, which extends over the light-emitting surface 410 of the optoelectronic semi-conductor chip 400 and a part of the upper side 501 of the screen 500. For this purpose, the dam 700 and the edge area 520 of the opening 510 of the screen 500 are designed and arranged so that the edge area 520 of the opening 510 of the screen 500 directly adjoins the dam 700. The electrically conductive layer 800 extends over the light-emitting surface 410, a part of the dam 700, and the edge area 520 of the screen 500 to the upper side 501 of the screen 500. The electrically conductive layer 800 can be applied in this variant of the optoelectronic component 100, for example, by spraying on after the screen 500 has been arranged above the housing body 300 and the optoelectronic semiconductor chip 400.

Alternatively, the electrically conductive layer 800 can be arranged on the light-emitting surface 410 of the optoelec-tronic semiconductor chip 400 and on at least a part of a potting material 710 arranged in the chip cavity 310 as in the variant of FIG. 13. The electrically conductive layer 800 can optionally also extend here over at least a part of the upper side 310 of the housing body 300. In this variant, the electrically conductive layer 800 is applied, for example, by spraying on, before the arrangement of the screen 500. The screen 500 is then arranged and an electrically conductive connection is established between the screen 500 and the electrically conductive layer 800. This electrically conductive connection can result either by a direct contact between the electrically conductive layer 800 and the lower side 502 of the screen 500 or by an electrically conductive material, such as an electrically conductive adhesive, arranged between the lower side 502 of the screen 500 and the electrically conductive layer 800. It has to be ensured in this variant of the optoelectronic component 100 that no undesired electrical short circuits result between the electrically conductive layer 800 and the bond wires 425.

A further possibility is to arrange the electrically conductive layer 800 on the upper side 401 of the optoelectronic semiconductor chip 400 so that a direct contact results between the electrically conductive layer 800 and an electrical contact surface 420 of the optoelectronic semiconductor chip 400, which is connected to the potential of the screen 500, for example a ground potential. A further possibility is that the electrically conductive layer 800 is connected via a bond wire to the potential of the screen 500. This can either be one of the bond wires 425 connected to the electrical contact surfaces 420 of the optoelectronic semiconductor chip 400 or a further bond wire.

The invention was illustrated and described in more detail on the basis of the preferred exemplary embodiments. Nonetheless, the invention is not restricted to the disclosed examples. Rather, other variations can be derived therefrom by a person skilled in the art without leaving the scope of protection of the invention.

LIST OF REFERENCE SIGNS

100 optoelectronic component
101 upper side
102 lower side
110 area
200 carrier
201 upper side
202 lower side
210 upper side metallization
211 upper contact surface
215 reference contact
220 lower side metallization
221 lower contact surface
230 through contact
240 opening
245 fastening material
300 housing body
301 upper side
302 lower side
310 chip cavity
320 connecting element cavity
400 optoelectronic semiconductor chip
401 upper side
402 lower side
410 light-emitting surface
420 electrical contact surface
425 bond wire
500 screen
501 upper side
502 lower side

510 opening
520 edge area
521 slot
530 side wall
540 contact area
550 soldering surface
560 light-absorbing coating
570 laser marking
580 upper part
590 lower part
600 connecting element
610 bent-over section
620 contact area
630 fastening section
640 soldering surface
700 dam
710 potting material
800 electrically conductive layer
810 wavelength-converting material

The invention claimed is:

1. An optoelectronic component, having a carrier, an optoelectronic semiconductor chip, and a metallic screen,
  wherein the optoelectronic semiconductor chip has an upper side having a light-emitting surface,
  wherein a dam bordering the light-emitting surface is arranged on the upper side of the optoelectronic semiconductor chip,
  wherein the optoelectronic semiconductor chip is arranged on an upper side of the carrier so that the light-emitting surface faces away from the upper side of the carrier,
  wherein the screen is arranged above the upper side of the carrier and the optoelectronic semiconductor chip,
  wherein the screen has an opening, which is arranged above the light-emitting surface.

2. The optoelectronic component as claimed in claim 1,
  wherein a housing body is arranged on the upper side of the carrier,
  wherein the optoelectronic semiconductor chip is arranged in a cavity of the housing body.

3. The optoelectronic component as claimed in claim 2,
  wherein the screen is fastened on an upper side of the housing body.

4. The optoelectronic component as claimed in claim 1, wherein the screen has a light-absorbing coating.

5. The optoelectronic component as claimed in claim 1, wherein the screen has a connecting element, which is electrically conductively in contact with an electrical contact on the upper side of the carrier.

6. The optoelectronic component as claimed in claim 5,
  wherein the connecting element is formed by a section of the screen bent over in relation to a surrounding area of the screen.

7. The optoelectronic component as claimed in claim 5, wherein the connecting element is fastened on the screen.

8. The optoelectronic component as claimed in claim 1,
  wherein the screen has a connecting element, which forms an accessible soldering surface on a lower side of the optoelectronic component.

9. The optoelectronic component as claimed in claim 1,
  wherein the screen has a side wall, which laterally encloses an area between the carrier and the screen.

10. The optoelectronic component as claimed in claim 9,
  wherein the side wall is electrically conductively in contact with an electrical contact on the upper side of the carrier.

11. The optoelectronic component as claimed in claim 9, wherein the side wall laterally encloses the carrier.

12. The optoelectronic component as claimed in claim 11, wherein a section of the side wall forms an accessible soldering surface on a lower side of the optoelectronic component.

13. The optoelectronic component as claimed in claim 1, wherein an edge area bordering the opening of the screen is bent in the direction toward the upper side of the carrier.

14. The optoelectronic component as claimed in claim 1, wherein a potting material is arranged in the cavity of the housing body, wherein the optoelectronic semiconductor chip is at least partially embedded in the potting material.

15. The optoelectronic component as claimed in claim 1, wherein an electrically conductive layer, which is electrically conductively connected to the screen, is arranged on the light-emitting surface.

16. The optoelectronic component as claimed in claim 15, wherein the electrically conductive layer comprises a wavelength-converting material.

17. The optoelectronic component as claimed in claim 15, wherein the electrically conductive layer extends on an upper side of the screen facing away from the carrier.

18. The optoelectronic component as claimed in claim 15, wherein the electrically conductive layer is in direct contact with an electrical contact surface of the optoelectronic semiconductor chip or with a bond wire connected to the optoelectronic semiconductor chip.

19. The optoelectronic component as claimed in claim 1, wherein the screen has a laser marking.

* * * * *